(12) United States Patent
Suehiro et al.

(10) Patent No.: US 9,640,730 B2
(45) Date of Patent: May 2, 2017

(54) LIGHT EMITTING DEVICE

(75) Inventors: Yoshinobu Suehiro, Kiyosu (JP); Koji Tasumi, Kiyosu (JP)

(73) Assignee: TOYODA GOSEI CO., LTD., Kiyosu-Shi, Aichi-Ken (JP)

(*) Notice: Subject to any disclaimer, the term of this patent is extended or adjusted under 35 U.S.C. 154(b) by 893 days.

(21) Appl. No.: 13/550,510

(22) Filed: Jul. 16, 2012

(65) Prior Publication Data

US 2013/0033870 A1  Feb. 7, 2013

(30) Foreign Application Priority Data

Aug. 3, 2011 (JP) ................................. 2011-170074

(51) Int. Cl.
- *H01L 33/52* (2010.01)
- *H01L 33/50* (2010.01)
- *H01L 33/46* (2010.01)

(52) U.S. Cl.
CPC ............ *H01L 33/46* (2013.01); *H01L 33/507* (2013.01); *H01L 2224/16225* (2013.01); *H01L 2924/181* (2013.01); *H01L 2933/0091* (2013.01)

(58) Field of Classification Search
CPC .......................................... H01L 33/50–33/56
See application file for complete search history.

(56) References Cited

U.S. PATENT DOCUMENTS

| | | | |
|---|---|---|---|
| 7,824,937 B2 | 11/2010 | Suehiro et al. | |
| 8,154,047 B2 | 4/2012 | Suehiro et al. | |
| 8,294,177 B2 * | 10/2012 | Yamazaki | H01L 33/507 |
| | | | 257/100 |
| 2006/0043402 A1 | 3/2006 | Suehiro et al. | |
| 2006/0261364 A1 | 11/2006 | Suehiro et al. | |
| 2008/0068845 A1 * | 3/2008 | Aida et al. | 362/311 |
| 2008/0074029 A1 | 3/2008 | Suehiro | |
| 2008/0284315 A1 | 11/2008 | Tasumi et al. | |
| 2011/0101399 A1 | 5/2011 | Suehiro et al. | |

(Continued)

FOREIGN PATENT DOCUMENTS

| | | |
|---|---|---|
| JP | H11-284234 A | 10/1999 |
| JP | 2002-33517 A | 1/2002 |
| JP | 2006-100787 A | 4/2006 |

(Continued)

OTHER PUBLICATIONS

Japanese Office Action dated Aug. 5, 2014, with an English Translation thereof.

(Continued)

*Primary Examiner* — Mariceli Santiago
(74) *Attorney, Agent, or Firm* — McGinn IP Law Group, PLLC.

(57) ABSTRACT

A light emitting device, comprises an element mounting substrate with a circuit pattern at least on an element mounting surface of the element mounting substrate, a light emitting element mounted on the element mounting surface of the element mounting substrate and connected with the circuit pattern, a sealing member that seals the light emitting element and is bonded on the element mounting surface, and a coating layer that covers the element mounting side of the element mounting substrate inside the sealing member, wherein the coating layer has its refractive index smaller than that of the sealing member.

19 Claims, 15 Drawing Sheets

(56) References Cited

U.S. PATENT DOCUMENTS

2012/0193665 A1\* 8/2012 Yamada ................. H01L 33/46
 257/98

FOREIGN PATENT DOCUMENTS

| JP | 2008-071837 A | 3/2008 |
| JP | 2008-72043 A | 3/2008 |
| JP | 2009-231785 A | 10/2009 |
| JP | 2011-18704 A | 1/2011 |
| WO | WO 2004/082036 A1 | 9/2004 |
| WO | WO 2007/114306 A1 | 10/2007 |

OTHER PUBLICATIONS

Notification of Reason(s) for Refusal dated Apr. 1, 2014, with English translation.

\* cited by examiner

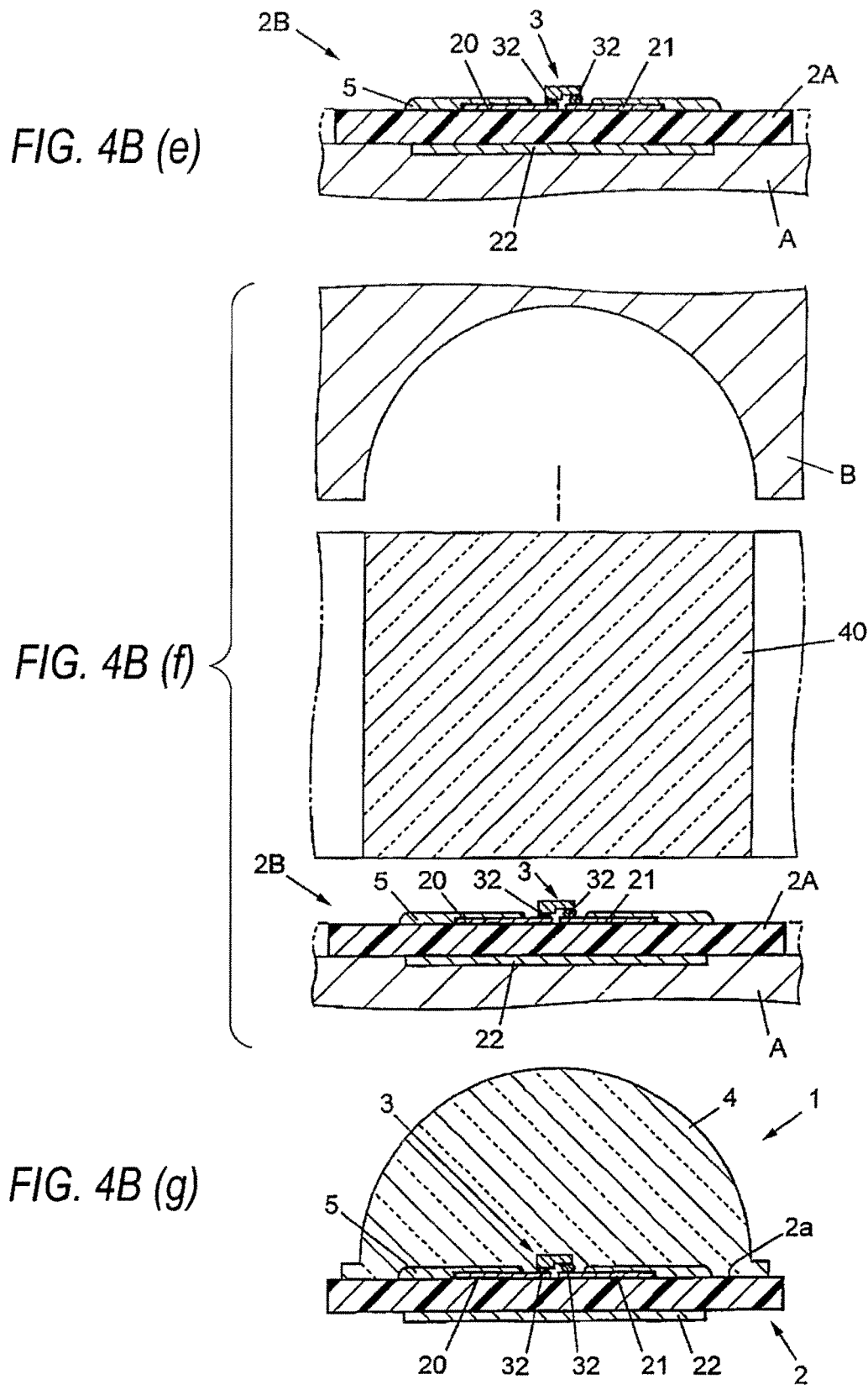

LIGHT EMITTING DEVICE

BACKGROUND OF THE INVENTION

1. Field of the Invention

The present invention relates to a light emitting device having a light emitting element sealed by a sealing member made of, for example, glass.

2. Description of the Related Art

It is well known that the light emitting device, which blends the light emitted from a light emitting diode (LED) element with the wavelength conversion light emitted by a phosphor pumped by the aforementioned light to obtain white light, has been adopted in practical applications.

It is well known in the related art that the light emitting device of this type includes an element mounting substrate, an LED element mounted on the element mounting substrate, and a sealing member that seals the LED element (for example, see: Patent Reference 1).

The element mounting substrate includes a substrate main body and a circuit pattern. The substrate main body is made of a ceramic material, and the circuit pattern is formed by metallizing on the outer/back surfaces of the substrate main body.

The LED element is a blue light LED element that emits blue light. It is mounted on the element mounting side of the element mounting substrate, and it is connected with the circuit pattern.

The sealing member is made of a glass containing a phosphor that emits yellow light when pumped by the blue light emitted from the LED element.

For the light emitting device that has the aforementioned constitution, the blue light emitted from the LED element and the yellow wavelength conversion light emitted from the phosphor pumped by the blue light are blended with each other to form white light.

Patent Reference 1: JP-A-2008-71837

However, the light emitting device described in Patent Reference 1 has some problems. That is, a portion of the light is absorbed by the substrate main body and the circuit pattern of the element mounting substrate, and loss in light takes place as the light goes through the substrate main body, decreasing the light output efficiency, which is undesirable. For example, when the surface of the circuit pattern is treated by plating of gold (Au), about 60% of the light quantity among the light quantity of the blue light emitted from the LED element is absorbed. When the circuit pattern is made of tungsten (W) and chromium (Cr), light absorption over that of Au takes place easily. Even when the material of the substrate main body is made of aluminum nitride (AlN) or silicon (Si), the light absorption is still too significant to be neglected.

SUMMARY OF THE INVENTION

Consequently, the object of the present invention is to provide a light emitting device that can decrease the loss in light and can increase the light output efficiency.

Light emitting devices described in (1) through (14) are provided as an embodiment of the present invention in order to realize the object (1) A light emitting device including an element mounting substrate with a circuit pattern at least on the element mounting surface, a light emitting element mounted on the element mounting surface of the element mounting substrate and connected with the circuit pattern, a sealing member that seals the light emitting element and is bonded on the element mounting surface, and a coating layer that covers the element mounting side of the element mounting substrate inside the sealing member; and the coating layer has its refractive index smaller than that of the sealing member.

(2) The light emitting device according to the aforementioned (1), wherein the sealing member has a critical angle $\theta_c$ of $\theta_c \leq 70°$ with respect to the coating layer.

(3) The light emitting device according to the aforementioned (1) or (2), wherein the coating layer contains a light scattering material scattered therein.

(4) The light emitting device according to the aforementioned (1) or (2), wherein the coating layer contains a phosphor dispersed therein, and the phosphor receives the light emitted from the light emitting element and gets pumped to emit the wavelength conversion light.

(5) The light emitting device according to any one of the aforementioned (1) through (4), wherein the coating layer has the roughness of the bonding surface with the sealing member lower than the roughness of the element mounting substrate.

(6) The light emitting device according to any one of the aforementioned (1) through (5), wherein the element mounting substrate, excluding the bonding region with the sealing member, and the circuit pattern, excluding the connecting region with the light emitting element, are covered with the coating layer.

(7) The light emitting device according to any one of the aforementioned (1) through 6, wherein, in the light emitting device according to any of the aforementioned (1) through (6), the light emitting element uses a substrate made of the same material as the epitaxial growth thin film material.

(8) The light emitting device according to any one of the aforementioned (1) through (7), wherein the sealing member has the externally exposed surface formed as a semispherical surface.

(9) The light emitting device according to any one of the aforementioned (1) through (7), wherein the sealing member has the end surface facing the light emitting surface of the light emitting element formed as a flat surface.

(10) The light emitting device according to any one of the aforementioned (1) through (7), wherein the sealing member has its end surface facing the light emitting surface of the light emitting element formed as a rough surface.

(11) The light emitting device according to any one of the aforementioned (1) through (7), wherein the sealing member has a main body part that seals the light emitting element, and a cover part the covers the end surface of the main body part on the side opposite to the element side, and the cover part is formed from a material having a refractive index smaller than the refractive index of the material of the main body part.

(12) The light emitting device according to any one of the aforementioned (9) through (11), wherein the sealing member contains a phosphor dispersed therein, with the phosphor receiving the light emitted from the light emitting element and pumped to generate a wavelength conversion light.

(13) The light emitting device according to the aforementioned (11) or (12), wherein the sealing member has the interface between the main body part and the cover part formed as an embossed surface.

(14) The light emitting device according to the aforementioned (12) of (13), wherein the sealing member has the volumetric concentration of the phosphor in the cover part higher than the volumetric concentration of the phosphor in the main body part.

According to the present invention, it is possible to reduce the loss in light, and it is possible to increase the light output efficiency.

BRIEF DESCRIPTION OF THE DRAWINGS

FIG. 4A (a) shows the step of operation of formation of the glass before sealing. FIG. 4A (b) shows the step of operation of formation of the element mounting substrate. FIG. 4A (c) shows the step of operation of formation of the coating layer, and FIG. 4A (d) shows the step of operation of formation of mounting of the LED element.

FIG. 4B (e) through FIG. 4B (g) are cross-sectional views illustrating the manufacturing method of the light emitting device related to Embodiment 1 of the present invention. FIG. 4B (e) and FIG. 4B (f) show the steps of operation of sealing of the LED element, and FIG. 4B (g) shows the step of operation of dividing of a light emitting device aggregate.

Figure 1:
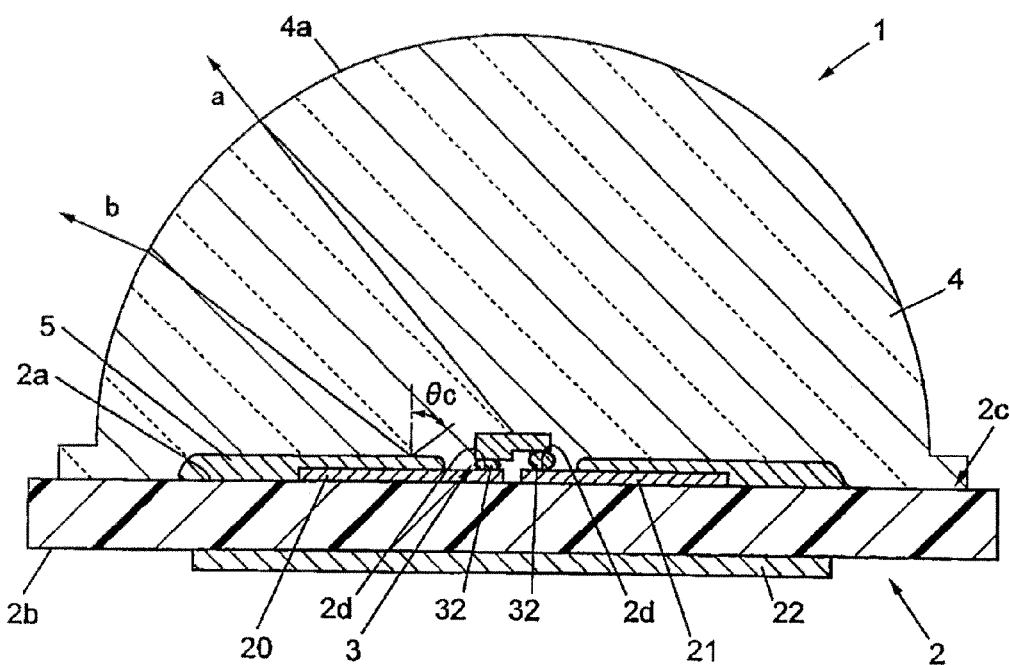
FIG. 1 is a cross-sectional view illustrating the light emitting device related to Embodiment 1 of the present invention.
Figure 2:
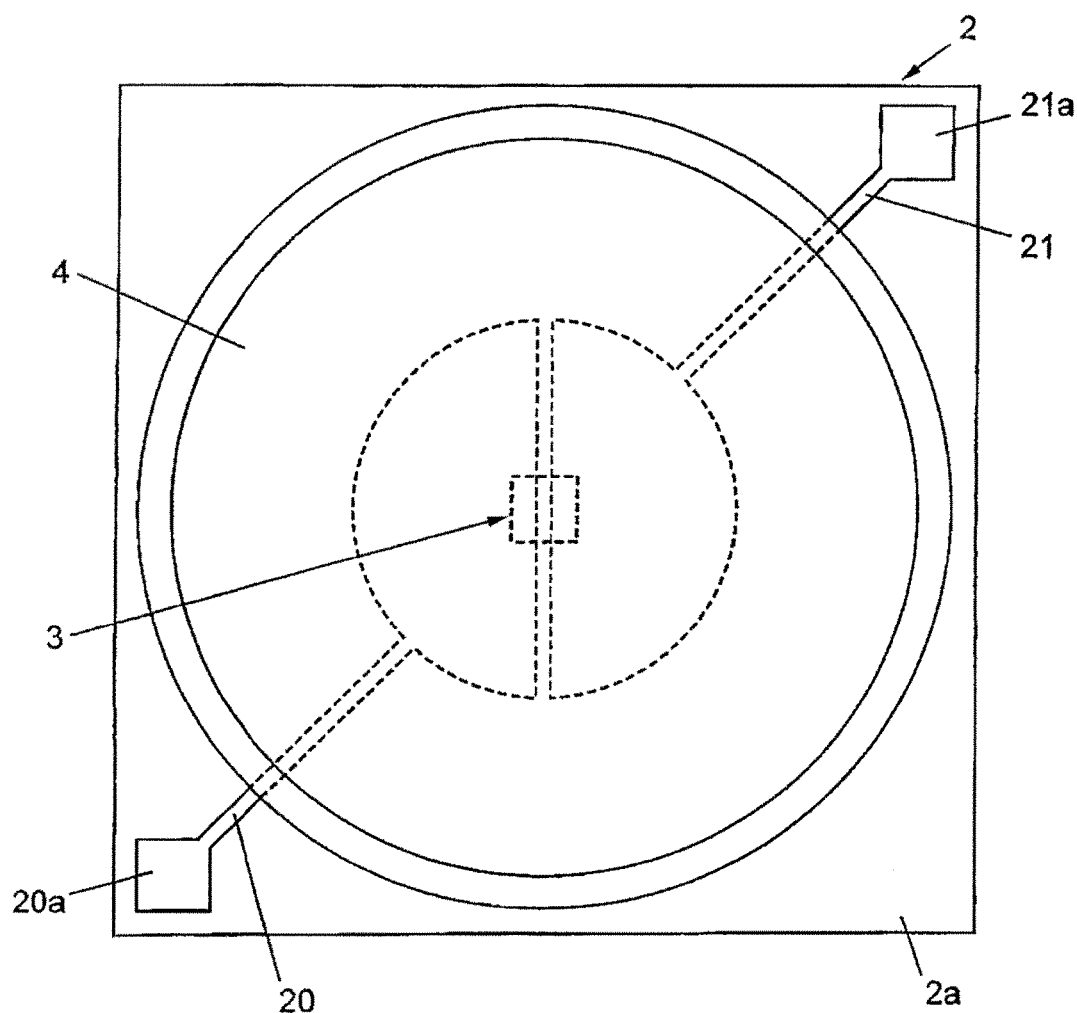
FIG. 2 is a schematic bottom view illustrating the circuit pattern of the element mounting substrate in the light emitting device related to Embodiment 1 of the present invention.

DESCRIPTION OF THE PREFERRED EMBODIMENTS (Embodiment 1)
The light emitting device related to Embodiment 1 will be explained in detail with reference to the drawings.
(Overall Constitution of the Light Emitting Device)
FIG. 1 is a diagram illustrating the overall light emitting device. As shown in FIG. 1, the light emitting device 1 roughly includes an element mounting substrate 2, an LED element 3 as the light emitting device mounted on the element mounting substrate 2, a sealing member 4 that seals the LED element 3, and a coating layer 5 that covers a portion of the element mounting surface 2a (outer surface) of the element mounting substrate 2 inside the sealing member 4.
(Constitution of the Element Mounting Substrate 2)
FIG. 2 is a diagram illustrating a circuit pattern. The element mounting substrate 2 is formed as a plate member nearly in a planar square shape made of a ceramic material of aluminum oxide ($Al_2O_3$) with a thermal expansion coefficient of, for example, $7\times10^{-6}/°$ C., and with a refractive index $n_1$ of, for example, $n_1=1.7$. In addition to $Al_2O_3$, materials that can also be used in making the element mounting substrate 2 include silicon (Si), aluminum nitride (AlN), and white resin. The thickness of the element mounting substrate 2 is selected to be, for example, about 0.25 mm. In particular, when a heat melting glass is used as the sealing member, it is necessary to have a heat resistance of 300° C. or higher, so that the ceramic material is preferred.

As shown in FIG. 2, a circuit pattern 20 connected with the p-side electrode 30 (p-side pad electrode 30a, which will be explained later) and a circuit pattern 21 connected with the n-side electrode 31 (to be explained later) of the LED element 3 are arranged on the element mounting surface 2a of the element mounting substrate 2.

The circuit patterns 20, 21 are arranged side-by-side in the planar direction of the element mounting substrate 2, and are entirely formed from tungsten (W), molybdenum (Mo), and other high melting point metals, as well as nickel (Ni) and silver (Ag) of the surface layer.

Figure 3:
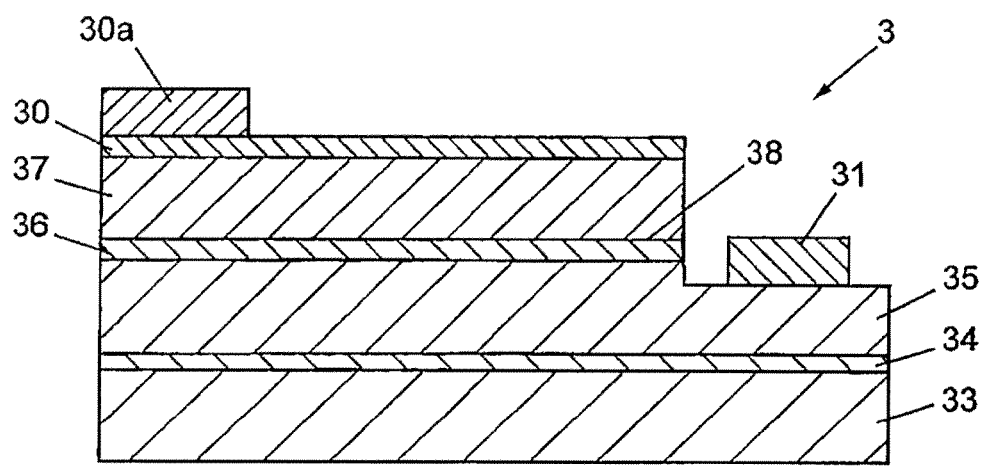
FIG. 3 is a cross-sectional view illustrating the light emitting element of the light emitting device related to Embodiment 1 of the present invention.

One circuit pattern 20 has an electrode 20a for supplying a power supply voltage to the LED element 3 (shown in FIG. 1), and it is formed as a surface pattern connected with the p-side pad electrode 30a of the LED element 3 (shown in FIG. 3).

The other circuit pattern 21 has an electrode 21a for supplying a power supply voltage to the LED element 3, and it is formed as a surface pattern connected with the n-side electrode 31 of the LED element 3 (shown in FIG. 3).

A heat releasing pattern 22 is arranged on the back surface 2b of the element mounting substrate 2 to cover the portion corresponding to the mounting region of the LED element 3 and to release heat from the LED element 3.
(Constitution of the LED Element 3)
FIG. 3 is a diagram illustrating the LED element. As shown in FIG. 3, the LED element 3 has a p-side electrode 30 and an n-side electrode 31. Here, the p-side electrode 30 (p-side pad electrode 30a) is flip-chip connected to the circuit pattern 20, and the n-side electrode 31 is flip-chip connected to the circuit pattern 21 via Au or other bumps 32 (shown in FIG. 1). As a result, the LED element is mounted on almost the central portion of the element mounting surface 2a of the element mounting substrate 2 (the element mounting portion). Also, the LED element 3 is arranged at the central portion of the sealing member 4, that is, at the position almost equal to any point on the outer exposed surface 4a of the sealing member 4. A blue LED element with an almost square planar shape and having a thermal expansion coefficient of, for example, $7 \times 10^{-6}/°$ C. is adopted as the LED element 3.

Here, the LED element 3 is formed by epitaxial growth of, for example, a group-III nitride based semiconductor on the surface of a substrate 33 made of gallium nitride (GaN) at the temperature of 700° C., so that the following layers are sequentially formed: a buffer layer 34, an n-type semiconductor layer 35, an MQW (Multiple Quantum Well) layer 36 as the light emitting layer, and a p-type semiconductor layer 37. As a result, this structure can emit light having light emitting color (light with color from near-UV to violet blue) with peak light emitting wavelength at, for example, 390 nm to 420 nm from the light emitting surface 38. The heat resistant temperature of the LED element 3 is 600° C. or higher, so that it is stable at the processing temperature in the element sealing processing operation using the low melting point glass that will be explained later. In addition to the gallium nitride (GaN) base material, the materials for making the LED element 3 also include silicon carbide (SiC) and gallium oxide ($Ga_2O_3$) as the material of the substrate 33.

The p-side electrode 30 has the p-side pad electrode 30a, and it is arranged on the back side of the p-type semiconductor layer 37. The n-side electrode 31 is arranged on the exposed portion (the n-type semiconductor layer 35) prepared by mounting out etching treatment for a portion from the p-type semiconductor layer 37 to the MOW layer 36 and the n-type semiconductor layer 35. Examples of the materials for making the p-side electrode 30 include the transparent electroconductive materials, such as ITO (indium tin oxide) and other oxides, as well as high reflectivity electroconductive materials, such as Ag alloy, Rh alloy, etc. Examples of the materials for the p-side pad electrode 30a and the n-side electrode 31 include Ni/Au. Al, and other metals.

(Constitution of the Sealing Member 4)

As shown in FIG. 1, the sealing member 4 is made of a transparent glass almost in a semispherical shape, and it is bonded by heat fusion on the element mounting surface 2a of the element mounting substrate 2. The outer exposed surface 4a of the sealing member 4 is formed in an almost semispherical surface. As a result, the light quantity of the light passing through the sealing member 4 from the side of the LED element 3 is larger than that when a sealing member in a quadratic prism shape is adopted, and this contributes to the increase in the light output efficiency. One may use the heat fusion glass of $ZnO-B_2O_3-SiO_2$ type with refractive index $n_2$ of, for example, $n_2=1.85$ as the material of the sealing member 4. The composition of the heat fusion glass is not limited to the aforementioned embodiment, and it may also contain the ingredients of $Bi_2O_3$, $ZrO_2$, and $TiO_2$. In addition to the heat fusion glass, one may also use a high refractive index resin containing sulfur (S).

A preferable material for making the sealing member 4 is the material that has a thermal expansion coefficient of $6 \times 10^{-6}/°$ C., a thermal expansion coefficient smaller than double the thermal expansion coefficient of the element mounting substrate 2 and the LED element 3. The reason is as follows: if the thermal expansion coefficient of the LED element 3 is over double the thermal expansion coefficient of the element mounting substrate 2 and the LED element 3, peeling or cracking of the sealing member 4 may take place easily. On the other hand, when the thermal expansion coefficient of the sealing member 4 is selected to be lower than double the thermal expansion coefficient of the element mounting substrate 2 and the LED element 3, it is possible to suppress peeling and cracking of the sealing member 4. In addition, the sealing member 4 may also contain a light scattering material with a refractive index different from the refractive index of the material of the sealing member.

(Constitution of the Coating Layer 5)

As shown in FIG. 1, the coating layer 5 is formed using the sol-gel method on the element mounting surface 2a of the element mounting substrate 2 by using a $SiO_2$ based glass with refractive index $n_3$ of, $n_3=1.43$. Then, the coating layer 5 has a constitution that covers the element mounting surface 2a and the circuit patterns 20, 21, excluding the bonding region 2c with respect to the element mounting substrate 2 (element mounting surface 2a) of the sealing member 4, and the connecting region 2d with respect to the element mounting substrate 2 (the circuit patterns 20, 21). As a result, the light from the side of the LED element 3 can be reflected easily from the interface between the sealing member 4 and the coating layer 5, so that the light quantity that can reach the element mounting substrate 2 can be decreased. The ratio of $n_3/n_2$, that is, the ratio of the refractive index $n_3$ of the coating layer 5 to the refractive index $n_2$ of the sealing member 4, should be selected to be in the range of $n_3/n_2 \leq 0.940$ (or preferably with $n_3/n_2=0.866$). As a result, the critical angle $\theta_c$ from the sealing member 4 to the coating layer 5 becomes $\theta_c \leq 70°$ (or preferably $\theta_c < 60°$). When $\theta_c$ has the value of $\theta_c=70°$, 65°, 60°, the solid angles in the angular range for generating total reflection are $0.34\pi$ steradian, $0.42\pi$ steradian, and $0.5\pi$ steradian, respectively, and the value is sufficiently significant in the angular range of $2\pi$ steradian from the central axis to 90°. By forming bonding region 2c without forming coating layer 5, it is possible to have the glass and the polycrystal alumina bonded strongly with each other. That is, the glass enters the unevenness of the alumina grain boundary to realize an anchoring effect, and the glass and alumina are chemically bonded with each other.

The coating layer 5 can be formed using the sputtering method on the element mounting surface 2a and circuit patterns 20, 21 of the element mounting substrate 2, or by means of vapor deposition using the electron beam vapor deposition method. In addition to the $SiO_2$ based glass, the material of the coating layer 5 may also be made of a fluorine based glass. The coating layer 5 may also contain a light scattering material, such as $Al_2O_3$, $Ti_2$, ZnO or other oxide having a refractive index ($n_3=1.43$) larger than the refractive index of the coating layer. In addition, the coating layer 5 may also contain a phosphor (a phosphor that is pumped by the light from the LED element 3 and emits the wavelength conversion light) dispersed therein. In this case, even when the surface roughness of the polycrystal ceramic material is Ra 0.2 to 0.3 μm, it is still possible to have the surface roughness of the joint interface between the coating layer 5 and the sealing member 4 of Ra 0.1 μm or smaller. As the surface roughness of the joint interface with the sealing member 4 is decreased, it is possible to decrease the area of the joint interface no that the shape makes it difficult to have the total reflected light from reaching the joint interface again, and it is possible to realize the effect in reducing the light entering the element mounting substrate 2.

For the light emitting device 1 that has the aforementioned constitution, when a voltage is applied on the LED element 3, light is generated in the LED element 3. For the LED element 3, instead of sapphire, a substrate made of the same material as that for the epitaxial growth thin film material is used, and it is sealed by the sealing member 4 with a high refractive index over 1.6, so that light can be emitted at a high efficiency to the sealing member 4. This feature can be seen clearly from the results of simulation disclosed by the present patent applicant in JP-A-2006-100787 (FIG. 16) (the results of simulation indicating the dependence of the external emission efficiency with respect to the LED element on the refractive index of the sealing material). Especially, setting the refractive index of the sealing member 4 with respect to the refractive index of the light emitting layer of the LED element 3 in the range of 0.68 to 0.85 makes it possible to have high light emission efficiency from the LED element 3 to outside the light emitting device 1.

The pulley 33 of the LED element 3 may also be made of a sapphire substrate, instead of a substrate made of gallium nitride (GaN) based material. As far as the sealing member 4 with a high refractive index is concerned, the effect is not so good as that in the case of the GaN substrate. However, it is possible to increase the emission efficiency from the LED element 3 to the sealing member 4.

Among the light rays emitted from the LED element 3, the light rays emitted upward within 90° with respect to the central axis of the LED element 3 are directly emitted out to the outer exposed surface 4a. Among the light rays emitted nearly in the lateral direction or obliquely downward at about 90° or over with respect to the central axis of the LED element 3, the light rays reaching the coating layer 5 are totally reflected from the coating layer 5, and are then emitted out to the outer exposed surface 4a. On the other hand, the light rays emitted obliquely downward at 110° to 120° with respect to the central axis of the LED element 3 are reflected by Ag on the surface of the circuit patterns 20, 21, and are then emitted outward to the outer exposed surface 4a.

(Manufacturing Method of the Light Emitting Devices 1)

The manufacturing method of the light emitting devices 1 of this embodiment will be explained in the following with reference to FIGS. 4A(a)-(d) and FIGS. 4B(e)-(g). Here, FIGS. 4A(a)-(d) and FIGS. 4B(e)-(g) illustrate the manufacturing procedure of the light emitting device.

The manufacturing method of the light emitting devices 1 is mounted out sequentially with the following steps of operation: "formation of glass before sealing", "formation of element mounting substrate", "formation of coating layer", "mounting of LDE [sic, LED] element", "sealing of LED element", and "dividing of light emitting device aggregate". These steps of operation will be explained in the following in order. This manufacturing method is only an example, and it is possible to make appropriate changes for the order of the various steps of operation.

(Formation of Glass Before Sealing)

First, oxide powder, which is the ingredient of the glass that will become the sealing member 4 (as shown in FIG. 1), is heated at 1200° C. to melt it, and it is stirred in this molten state. Next, the oxide powder in a molten state is solidified. After that, as shown in FIG. 4A(a), it is cut to the thickness corresponding to the thickness of the sealing member 4 to form the sealing member 40.

(Formation of the Element Mounting Substrate)

Figure 4A:
FIG. 4A (a) through FIG. 4A (d) are cross-sectional views illustrating the manufacturing method of the light emitting device related to Embodiment 1 of the present invention.
Figure 4A:
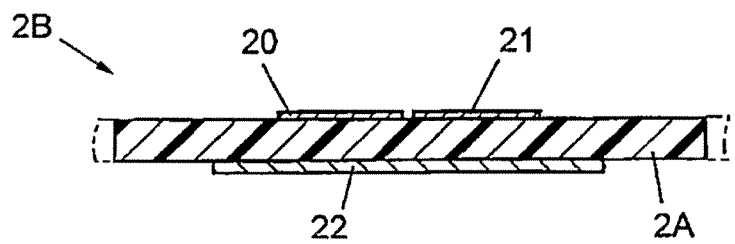
Figure 4A:
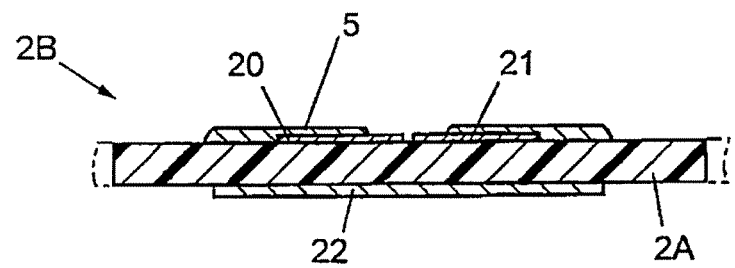
Figure 4A:
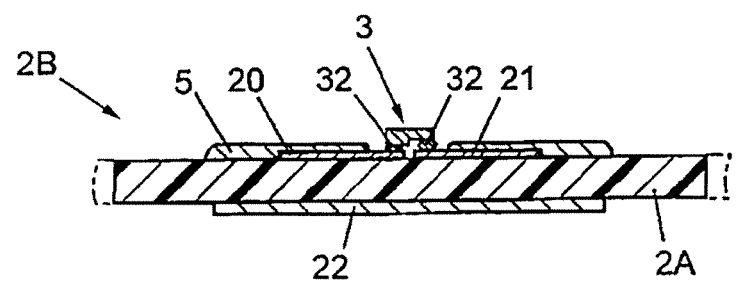

As shown in FIG. 4A(b), while the circuit patterns 20, 21 are formed on the substrate feed material 2A, the heat releasing pattern 22 is formed on the back surface of the substrate feed material 2A, so that a substrate aggregate 2B is formed as the element mounting substrate 2 (shown in FIG. 1). Formation of the circuit patterns 20, 21 is mounted out by screen printing a paste-like metal on the substrate feed material 2A, and, after sintering by heat treatment at a prescribed temperature (such as 1000° C. or higher), plating treatment is mounted out using another metal on the metal.

(Formation of Coating Layer)

As shown in FIG. 4A(c), for example, the sol-gel method is adopted to form the coating layer 5 made of $SiO_2$ based glass on the outer surface of the substrate aggregate 2B. In this case, formation of the coating layer 5 is mounted out excluding the bonding region 2c of the sealing member 4 with respect to the substrate aggregate 2B (shown in FIG. 1, end edge portion of the bonding region) and the connecting region 2d of the LED element 3 (shown in FIG. 1). Here, the area ratio of the bonding region of the coating layer 5/sealing member 4 is ½ or larger. The coating layer 5 can be formed by using an electron beam vapor deposition method or sputtering method instead of the sol-gel method. The coating layer 5 may also have the light scattering material of $Al_2O_3$, $TiO_2$, ZrO or the like dispersed therein. One may also use a low-refractive index material with a refractive index of 1.5 or smaller, such as fluorine based glass or the like, as the material of the coating layer 5, instead of the $SiO_2$ based glass.

One may also adopt a scheme in which the coating layer 5 is formed on the end surface of the substrate aggregate 2B including the bonding region 2c. However, for the scheme of arrangement of the bonding region 2c, it is possible to select the material of the coating layer 5, without considering the bonding strength between the substrate aggregate 2B or the sealing member 4 and the material of the coating layer 5. However, when the coating layer 5 is formed on the end surface (excluding the connecting region 2d) including the bonding region 2c, it is necessary to select the material and the operation scheme in consideration of the bonding strength with these parts.

(Mounting of LED Element)

As shown in FIG. 4A(d), the LED element 3 is mounted by bumps 32 on each element mounting portion of the substrate aggregate 2B. In this case, the p-side pad electrode 30a (shown in FIG. 3) is connected with the circuit pattern 20, and the n-side electrode 31 (shown in FIG. 3) is connected with the circuit pattern 21, respectively, via bumps 32 by flip-chip connection.

(Sealing of LED Element)

As shown in FIG. 4B(e), the substrate aggregate 2B mounting the LED element 3 on it is arranged on the lower die A. Then, as shown in FIG. 4B(f), the before-sealing glass 40 facing the LED element 3 is arranged between the upper die B and the lower die A. Then, the dies are closed in a nitrogen atmosphere and at a prescribed temperature, and the before-sealing glass 40 is pressed and heated. In this case, for example, the temperature is set at 600° C., and the pressure is set at 25 kg/cm². As a result, a light emitting device aggregate (not shown in the figure) with LED element 3 sealed by the sealing member 4 is formed.

(Dividing of Light Emitting Device Aggregate)

After opening of dies, the light emitting device aggregate is arranged inside a dicing device (not shown in the figure), and it is cut by a dicing blade (not shown in the figure), so that a plurality of light emitting devices 1 are divided, each having a LED element 3 sealed by the sealing member 4 on the element mounting surface 2a of the element mounting substrate 2 as shown in FIG. 4B(g).

(Advantage of Embodiment 1)

The following effects can be obtained with Embodiment 1 explained above.

Selection of the high-refractive index material can be mounted out easily in the glass sealing operation, and it is possible to have high light output efficiency from the LED element 3. On the other hand, for the element mounting substrate 2, there is a limit on the type of material that should be able to withstand the high temperature processing in glass sealing, and the loss in light caused by transmissivity and light absorption is a topic to be addressed. In order to solve this problem, [according to this embodiment], it is possible to decrease the loss in light caused by the coating layer 5 that has a refractive index smaller than that of the sealing member 4, and it is possible to increase the light output efficiency.

(Embodiment 2

Figure 5:
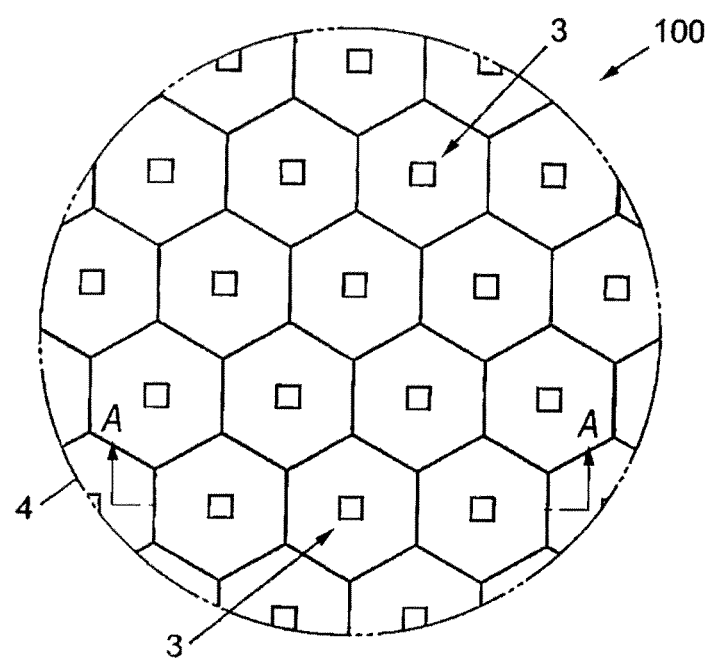
FIG. 5 is a plane view illustrating the light emitting device in Embodiment 2 of the present invention.
Figure 6:
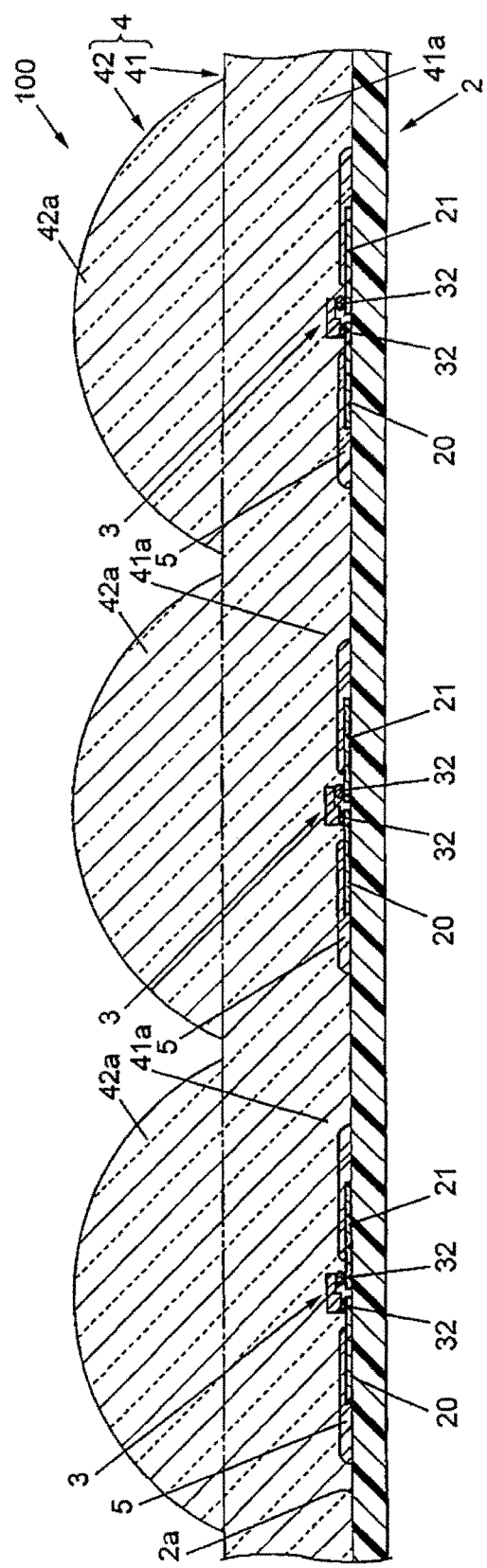
FIG. 6 is a cross-sectional view taken across A-A in FIG. 5.
Figure 7:
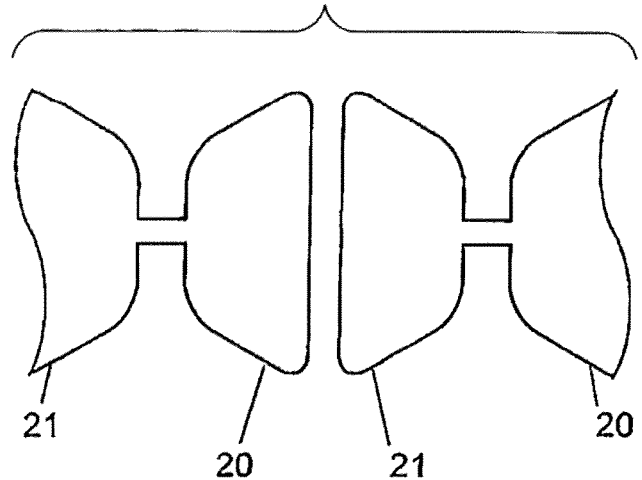
FIG. 7 is a schematic plane view illustrating the circuit pattern of the element mounting substrate in the light emitting device in Embodiment 2 of the present invention.
Figure 8:
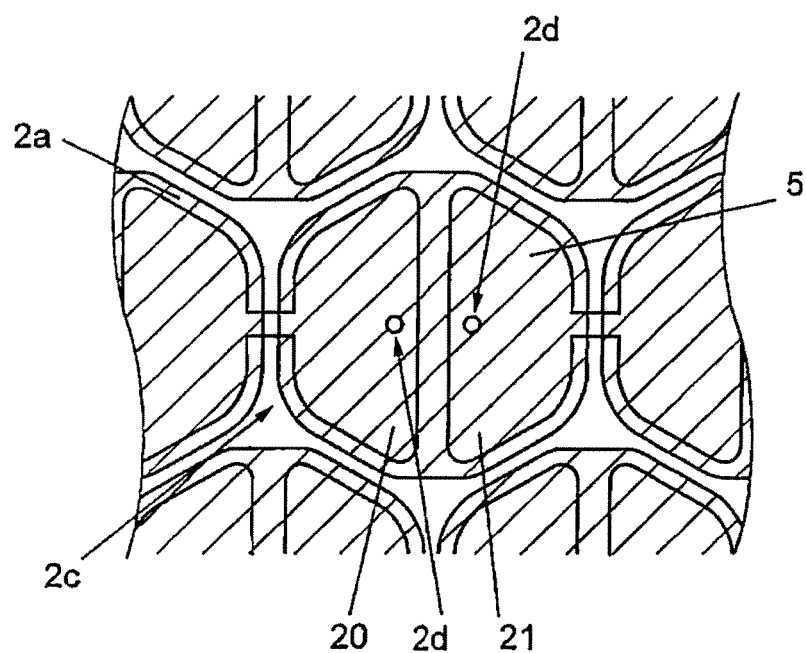
FIG. 8 is a schematic plane view illustrating the coating layer of the light emitting device related to Embodiment 2 of the present invention.
Figure 9:
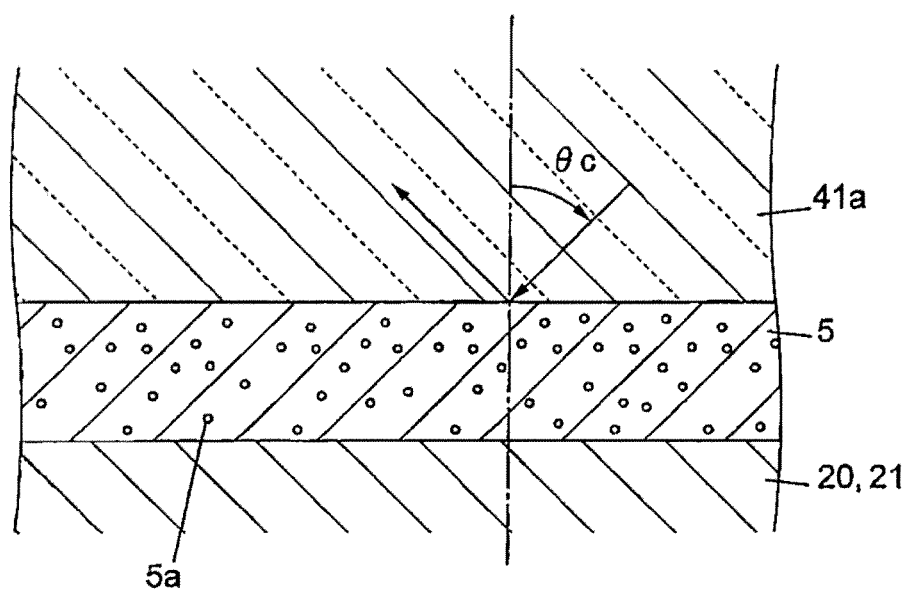
FIG. 9 is a cross-sectional view illustrating an example of light reflection of the coating layer in the light emitting device in Embodiment 2 of the present invention.

The light emitting device related to Embodiment 2 of the present invention will be explained in the following with reference to FIGS. 5 to 9. FIG. 5 and FIG. 6 show the light emitting device. FIG. 7 is a diagram illustrating the circuit pattern. FIG. 8 is a diagram illustrating the coating layer. FIG. 9 is a diagram illustrating an example of the light reflection at the coating layer. FIG. 5 to FIG. 9 adopt the same keys as those in FIG. 1 to FIG. 3, so detailed description will be omitted.

As shown in FIGS. 5 and 6, the light emitting device 100 in Embodiment 2 of the present invention has a plurality of LED elements 3 and lens surfaces sealed by the sealing member 4, and the coating layer 5 contains a light scattering material 5a dispersed therein.

A plurality of circuit patterns 20 connected with the p-side electrodes 30 (p-side pad electrodes 30a) of the LED elements 3, and a plurality of circuit patterns 21 connected with the n-side electrodes 31 are arranged on the element mounting surface (outer surface) 2a of the element mounting substrate 2. For a portion of the circuit patterns 20, 21 (circuit patterns 20, 21 arranged side-by-side in the lateral direction), the circuit patterns 20 and circuit patterns 21 are connected as shown in FIGS. 7 and 8. As a result, among the plurality of LED elements 3, the LED elements arranged side-by-side in the lateral direction, are connected in series with respect to the element mounting substrate 2.

The sealing member 4 has a first sealing member 41 and a second sealing member 42, and it is bonded by means of heat fusion on the element mounting surface 2a of the element mounting substrate 2.

The ZnO—B$_2$O$_3$—SiO$_2$ based heat fusion glass with refractive index n$_2$ of, for example, n$_2$=1.7, is used as the material of the sealing member 4 (the first sealing member 41 and the second sealing member 42). As shown in FIG. 9, the critical angle θ$_c$ with respect to the coating layer 5 is, for example, θ$_c$≤70° (or preferably θ$_c$≤60°) by selecting the low-refractive index coating member.

The sealing member 4 is formed in a convex lens shape corresponding to the LED elements 3. The front view becomes the hexagonal shape corresponding to the configuration of the LED elements 3 shown in FIG. 5, as the sealing member 4 is densely arranged.

Just as in Embodiment 1, the coating layer 5 is formed using, for example, the sol-gel method by using the SiO$_2$ based glass (ZnO—B$_2$O$_3$—SiO$_2$ based glass) with refractive index n$_3$ of, for example, n$_3$=1.45 on the element mounting surface 2a of the element mounting substrate 2. Here, the coating layer 5 is formed to cover the element mounting surface 2a and the circuit patterns 20, 21, at least excluding the bonding region 2c (shown in FIG. 8) with respect to the element mounting substrate 2 (element mounting surface 2a) of the sealing member 4, and the connecting region 2d (shown in FIG. 8) with respect to the element mounting substrate 2 (circuit patterns 20, 21) of the LED elements 3. As a result, the interface between the sealing member 4 and the coating layer 5 can easily reflect the light from the side of the sealing member 4, and the light quantity that can reach the element mounting substrate 2 decreases.

The coating layer 5 may also contain a light scattering material, such as Al$_2$O$_3$, TiO$_2$, ZnO or other oxide having a refractive index larger than the refractive index of the coating layer (n$_3$=1.45). As a result, when the light is incident from the side of the sealing member 4 to the coating layer 5 at an incidence angle larger than the critical angle θ$_c$, the incident light is totally reflected from the interface between the sealing member 4 and the coating layer 5. When the light is incident from the side of the sealing member 4 to the coating layer 5 at an incidence angle smaller than critical angle θ$_c$, the incident light goes into the coating layer 5 and is scattered by the light scattering material 5a. Here, a portion of the scattered light returns to the side of the sealing member 4, and it goes through the sealing member 4 and is output to the outer side. As a result, excluding a portion of the light, the light from the LED elements 3 cannot reach the element mounting substrate 2, and light absorption by the element mounting substrate 2 can be reduced.

According to Embodiment 2, there are a plurality of lens surfaces, and a plurality of LED elements 3 are sealed by the sealing member 4. Consequently, compared with Embodiment 1, output of the light from the side surface of the sealing member 4 becomes hard to take place, and, in addition to the light emitted obliquely downward from the LED elements 3, reflected light from the upper surface of the sealing member 4 also takes place. Most of the light rays emitted obliquely downward from the LED elements 3 becomes over the critical angle of the coating layer 5 (because the solid angle in this direction is large, the light quantity is large). On the other hand, the probability is high for the reflected light from the upper surface of the sealing member 4 to the coating layer 5 within the critical angle. On the other hand, as the light incident into the coating layer 5 is scattered, there is no light that can reach the element mounting substrate 2, and, even when a plurality of LED elements 3 and lenses are arranged, it is still possible to increase the light output efficiency.

(Advantage of Embodiment 2)

According to Embodiment 2 explained above, the same effects as those of Embodiment 1 can be realized. In addition, it is also possible to realize the effect that the light incident into the coating layer 5 does not reach the element mounting substrate 2.

(Embodiment 3)

Figure 10:
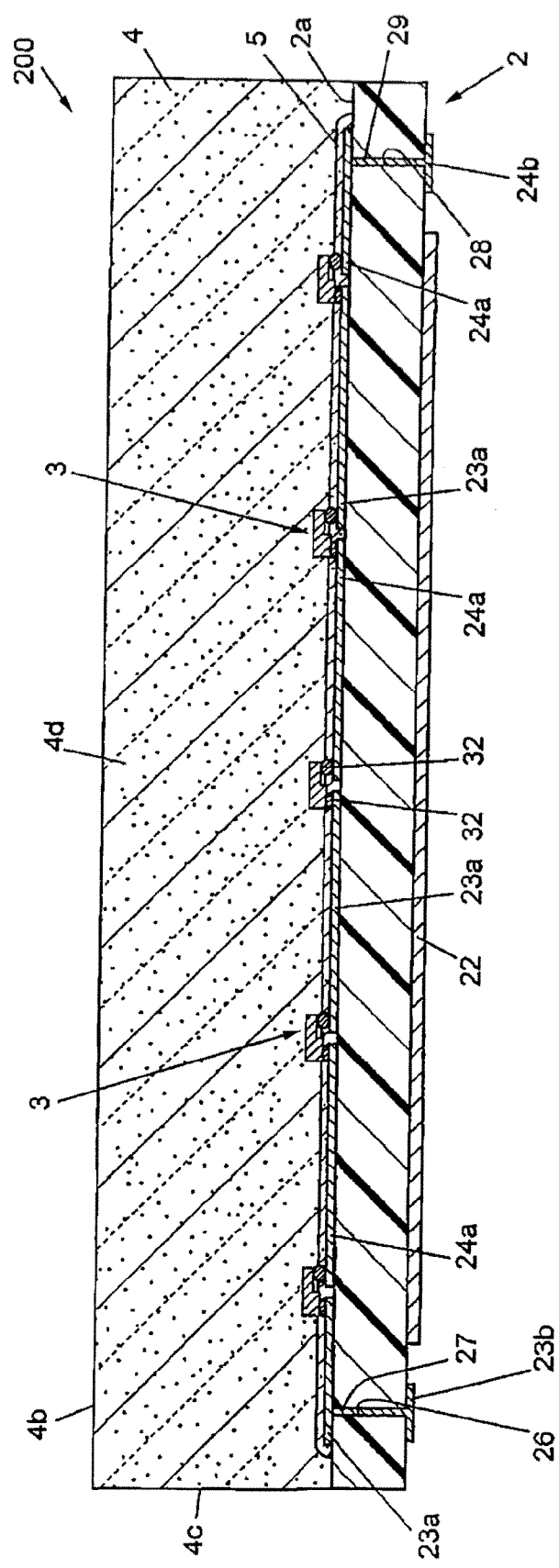
FIG. 10 is a cross-sectional view illustrating the light emitting device in Embodiment 3 of the present invention.
Figure 11:
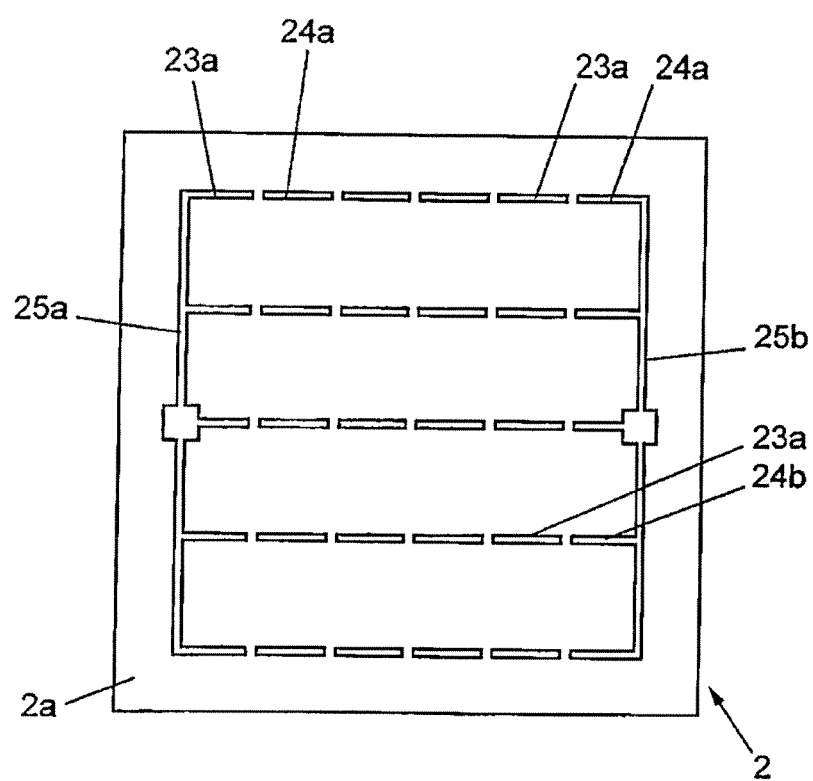
FIG. 11 is a schematic plane view illustrating the circuit pattern of the element mounting substrate in the light emitting device in Embodiment 3 of the present invention.
Figure 12:
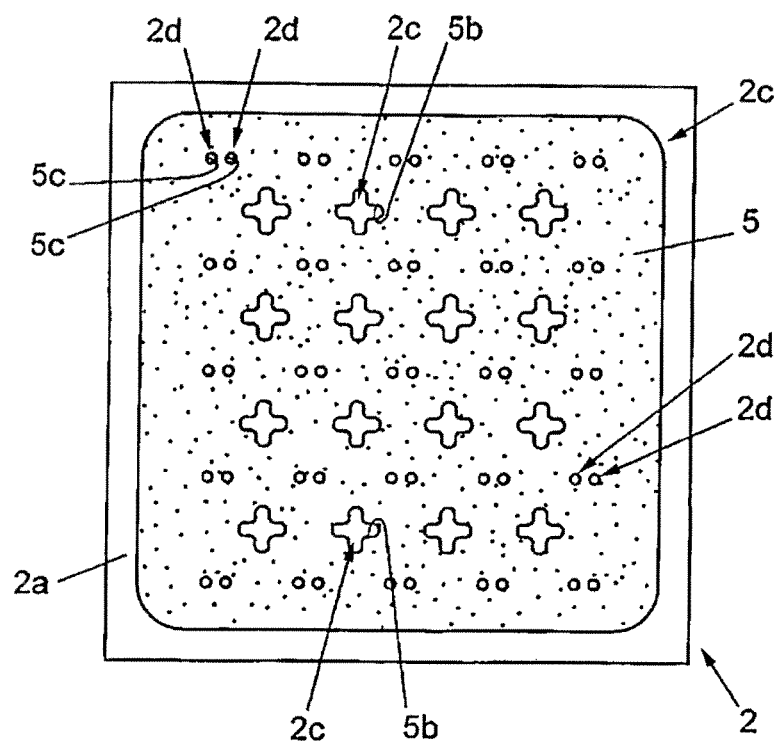
FIG. 12 is a schematic plane view illustrating the coating layer of the light emitting device in Embodiment 3 of the present invention.
Figure 13:
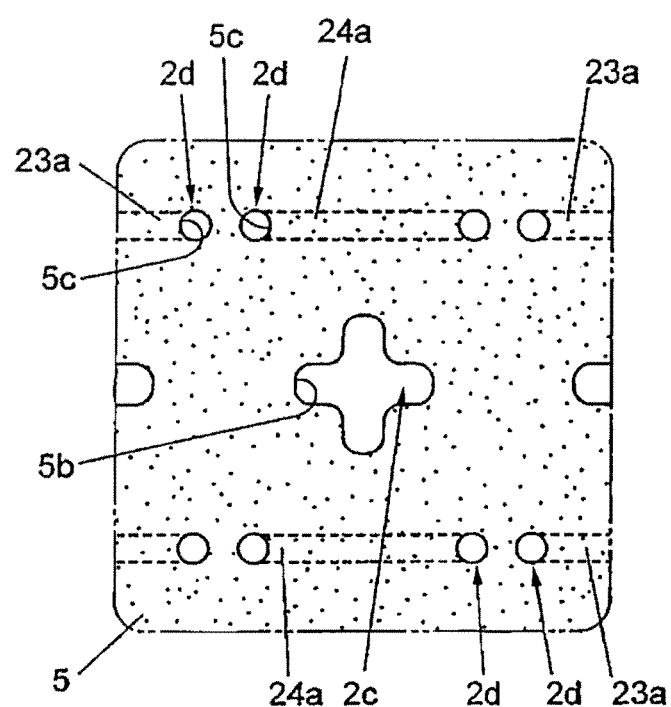
FIG. 13 is an enlarged plane view illustrating a portion of the coating layer of the light emitting device in Embodiment 3 of the present invention.
Figure 14:
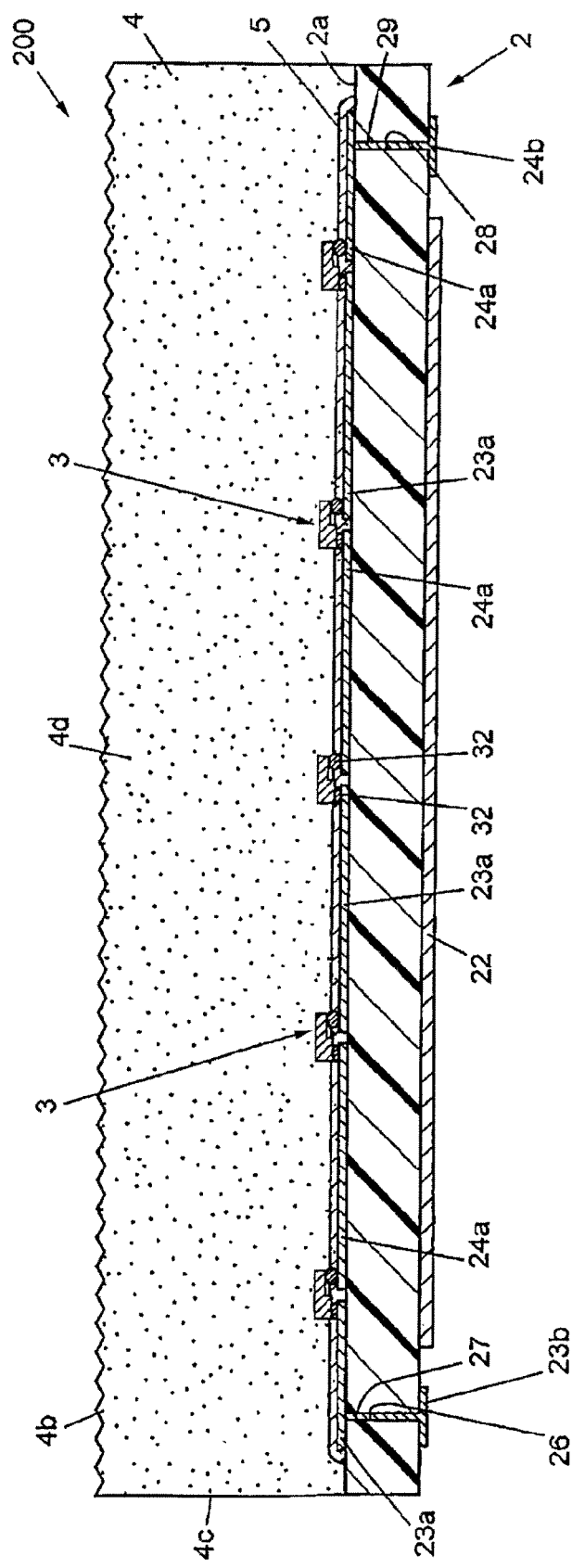
FIG. 14 is a cross-sectional view illustrating modified example (1) of the light emitting device in Embodiment 3 of the present invention.
Figure 15:
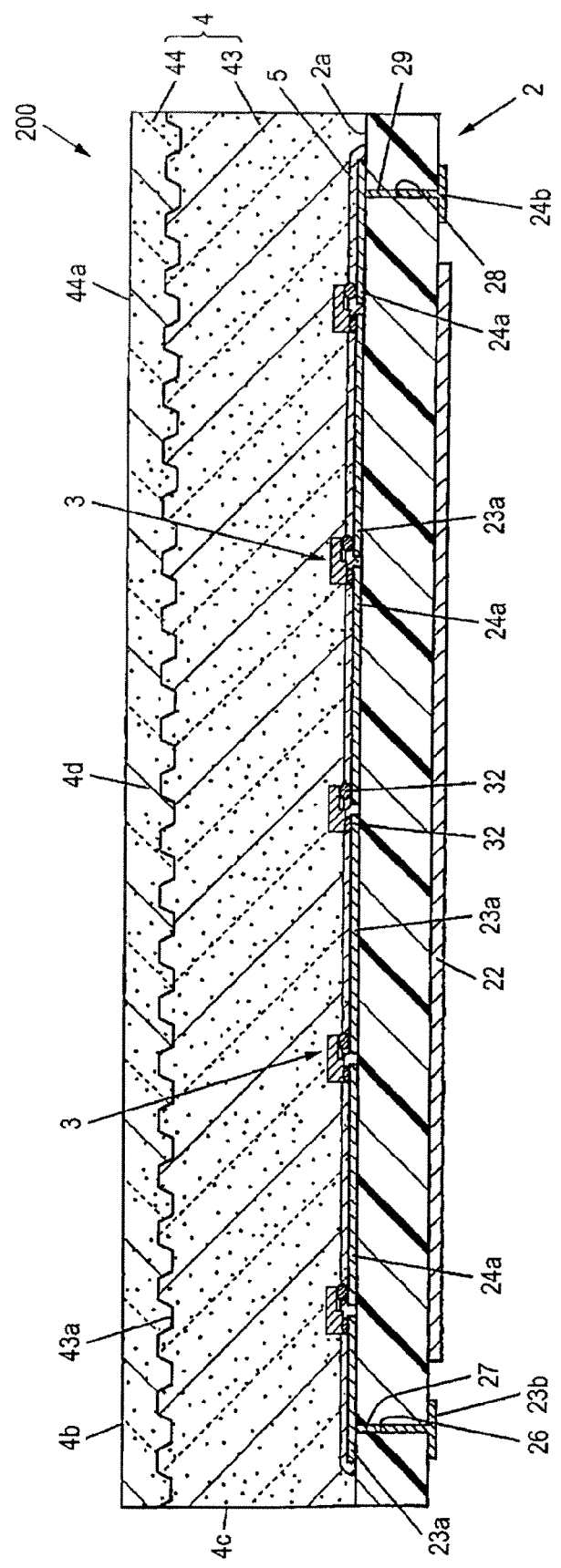
FIG. 15 is a cross-sectional view illustrating modified example (2) of the light emitting device in Embodiment 3 of the present invention.

The light emitting device related to Embodiment 3 of the present invention will be explained in the following with reference to FIGS. 10 to 15. FIG. 10 shows the light emitting device. FIG. 11 shows the circuit pattern. FIG. 12 and FIG. 13 show the coating layer. FIG. 14 shows the modified example (1). FIG. 15 shows the modified example (2). FIGS. 10 to 15 adopt the same keys as those in FIGS. 1 to 3, so detailed description will be omitted.

As shown in FIG. 10, the light emitting device 200 related to Embodiment 3 of the present invention has the end surface 4b of the sealing member 4 facing the light emitting surface 38 (shown in FIG. 3) of each of the LED elements 3 and it is formed as a flat surface.

Consequently, the sealing member 4 is a quadratic prism made of a transparent glass, with the end surface 4b having an almost square shape and with the side surface 4c having a rectangular shape. The various side surfaces 4c are arranged on the same surface as the side surface of the element mounting substrate 2, and are heat fused on the element mounting surface 2a of the element mounting substrate 2. Just as in Embodiment 2, the material of the sealing member 4 is the $ZnO$—$B_2O_3$—$SiO_2$ based heat fusion glass with a refractive index $n_2$ of, for example, $n_2=1.7$.

The sealing member 4 contains a phosphor 4*d* that is pumped by the light emitted from the LED elements 3 and emits a yellow wavelength conversion light. The phosphor is dispersed in the sealing member. As a result, the yellow light generated as the phosphor is pumped by the light emitted from the LED elements 3 is blended with the blue light to obtain white light. Also, it is possible to obtain the white light by using a combination of an LED element that emits the UV light together with a red phosphor, a green phosphor and a yellow phosphor pumped by the UV light. Examples of the phosphors that may be used include YAG (yttrium aluminum garnet) phosphor, silicate phosphor, nitride phosphor, sulfide phosphor, etc. The volumetric concentration of the phosphor 4*d* should be selected appropriately low so that the light emitting device 1 can have a chromaticity almost the same as the chromaticity of the light emitting device without the coating layer 5.

The element mounting substrate 2 is made of a plate-shaped member with an almost square planar shape, and the material is a ceramic material of aluminum oxide ($Al_2O_3$) with a thermal expansion coefficient of, for example, $7 \times 10^{-6}/°$ C., along with its refractive index $n_1$ being, for example, $n_1=1.7$. In addition to $Al_2O_3$, the materials that may be used for the element mounting substrate 2 include silicon (Si), aluminum nitride (AlN), and white resin.

As shown in FIG. 11, on the element mounting surface 2*a* (outer surface) of the element mounting substrate 2, a plurality of first circuit patterns 23*a*, 24*a* are arranged and connected with the p-side electrodes 30 (p-side pad electrodes 30*a*) and the n-side electrodes 31 of the LED elements 3. The plurality of first circuit patterns 23*a*, 24*a* are arranged in a configuration with 5 side-by-side in the lateral direction and 5 side-by-side in the longitudinal direction. Among the plurality of first circuit patterns 23*a*, 24*a*, the first circuit patterns 23*a* arranged side-by-side in the lateral direction on one end side are connected by the first common pattern 25*a*, and first circuit patterns 24*a* on the other end side are connected by the second common pattern 25*b*.

A plurality of second circuit patterns 23*b*, 24*b* are arranged on the back surface 2*b* of the element mounting substrate 2 for supplying the power supply voltage to the LED elements 3.

The first circuit patterns 23*a* (the first common patterns 25*a*) and the second circuit patterns 23*b* are electrically connected with each other by the via pattern 27 filled in via hole 26 through the element mounting substrate 2, and the first circuit patterns 24*a* (the second common patterns 25*b*) and the second circuit patterns 24*b* are electrically connected with each other by the via pattern 29 filled in the via hole 28 through the element mounting substrate 2. The first common patterns 25*a* and the second circuit patterns 23*b* are monolithically formed [and connected] to the via pattern 27, and the second common patterns 25*b* and the second circuit patterns 24*b* are monolithically formed [and connected] to the via pattern 29 using, for example, tungsten (W), molybdenum (Mo), or other high melting point metal, as well as nickel (Ni) and silver (Ag) of the surface layer.

Formed on the surfaces of the first circuit patterns 23*a*, 24*a*, the first common patterns 25*a*, the second common patterns 25*b*, and the second circuit patterns 23*b*, 24*b* is a single or a plurality of metal layers as needed from the materials of nickel (Ni), aluminum (Al), platinum (Pt), titanium (Ti), gold (Au), silver (Ag), copper (Cu), etc.

The LED elements 3 have p-side electrodes 30 and n-side electrodes 31 (both shown in FIG. 3), and the plurality thereof (for example, 25 thereof: 5 in the longitudinal direction and 5 in the lateral direction) are mounted on almost the central portion of the element mounting surface 2*a* of the element mounting substrate 2. Also, the p-side electrodes 30 (p-side pad electrodes 30*a*) are connected with the first circuit patterns 23*a* or the first circuit patterns 24*a*, and the n-side electrodes 31 are connected with the first circuit patterns 24*a* or the first circuit patterns 23*e*, respectively. Among the plurality of LED elements 3, in the lateral direction, 5 LED elements are electrically connected by the first circuit patterns 23*a*, 24*a*, and, in the longitudinal direction, 5 rows of the LED elements 3 are electrically connected side-by-side with respect to the first common patterns 25*a* and the second common patterns 25*b*.

As shown in FIGS. 12 and 13, just as in Embodiment 1, the coating layer 5 is formed using the sol-gel method on the element mounting surface 2*a* of the element mounting substrate 2 from the $SiO_2$ based glass with refractive index $n_3$ of, for example, $n_3=1.43$. Then, the coating layer 5 is formed to cover the element mounting surface 2*a* and the first circuit patterns 23*a*, 24*a*, at least excluding the bonding region 2*c* with respect to the element mounting substrate 2 (element mounting surface 2*a*) of the sealing member 4 and the connecting region 2*d* with respect to the element mounting substrate 2 (first circuit patterns 23*a*, 24*a*) of the LED elements 3.

The bonding region 2*c* of the sealing member 4 is the region on the element mounting side of the element mounting substrate 2. It is arranged on the portions corresponding to the square end edge of the element mounting substrate 2 (frame planar frame-shaped region) outside the mounting portion of the plurality LED elements 3, the portions corresponding to the cross points of the diagonal lines of the 16 planar square shaped regions with apex points at the 25 mounting portions arranged as a configuration in the longitudinal and lateral directions in the region of the mounting portion of the plurality of LED elements 3 (planar cross-shaped regions), and the portions where the circuit pattern is not formed. Consequently, a plurality of through holes 5*b* with an almost cross planar shape (16 holes in this embodiment) is arranged on the coating layer 5. As a result, while filled in the plurality of through holes 5*b*, the sealing member 4 is bonded with the element mounting surface 2*a* of the element mounting substrate 2, so that it is possible to improve the bonding degree of the sealing member 4 with respect to the element mounting substrate 2.

The connecting regions 2*d* of the LED elements 3 are regions on the element mounting side of the element mounting substrate 2, and are arranged on the portions (the regions with an almost planar circular shape) corresponding to the forming regions of the bumps 32. Consequently, a plurality of (50 in this embodiment) areas 5*c* without forming the coating layer with a nearly circular planar shape is formed on the coating layer 5. As a result, after mounting of the LED elements 3 on the element mounting substrate 2, the entirety of the element mounting portion is covered by the coating layer 5, and it is possible to suppress escape of the light from the LED elements 3 to the element mounting substrate 2.

(Advantage of Embodiment 3)

According to the Embodiment 3 explained above, in addition to the same effects as those of the Embodiment 2, it is possible to reduce the loss in light due to the element mounting substrate 2 for the scattered light from the phosphor grains dispersed in the sealing member 4 and the light generated by pumping due to the phosphor grains.

In this embodiment, explanation has been made on the case when the end surface 4b of the sealing member 4 is formed as a flat surface. However, the present invention is not limited to this scheme. One may also adopt a scheme in which the and surface 4b of the sealing member 4 is formed as a rough surface as shown in FIG. 14. In this case, as the surface area is increased, the light output efficiency can be increased. On the other hand, although the probability is increased that the light from the sealing member 4 is scattered and reflected to return to the side of the element mounting substrate 2, it is nevertheless possible to reduce the light lost from the coating layer 5 to the element mounting substrate 2. Formation of the rough surface is mounted out after sealing of the LED elements 3 by the sealing member 4 as the sealing member 4 is treated by sandblast treatment or chemical etching treatment.

According to the present invention, it is also possible to increase the light output efficiency even when the sealing member 4 is adopted as shown in FIG. 15. As shown in FIG. 15, the sealing member 4 has a main body part 43 that seals the LED elements 3, and a cover part 44 that covers the element side of the main body part 43 and the end surface 43a on the opposite side, and the cover part 44 is made of a material that has a refractive index $n_5$ ($n_5$=1.5) smaller than the refractive index $n_4$ ($n_4$=1.7) of the material of the main body part 43, and has a melting point higher than that of the sealing member 4. The sealing member 4 is formed as an embossed surface between the main body part 43 and the cover part 44.

The outer exposed surface 44a of the cover part 44 is formed as a flat surface. As a result, it is possible to suppress attachment of dust and generation of dirt on the outer exposed surface 44a of the cover part 44. Even when dust is attached on the outer exposed surface 44a, or when dirt is generated on it, it is still possible to clean it easily, which is an advantage.

One may also adopt a scheme in which phosphor is dispersed and contained in the main body part 43 and the cover part 44. In this case, the volumetric concentration of the phosphor in the cover part 44 is higher than that of the phosphor in the main body part 43, so that the color transformation efficiency of the light by the phosphor from the LED elements 3 can be increased, and the color unevenness on the exit object can be reduced.

The light emitting device of the present invention has been explained above with respect to the aforementioned embodiment. However, the present invention is not limited to the aforementioned embodiment. As long as the gist of the present invention is observed, various modifications may be adopted.

What is claimed is:

1. A light emitting device, comprising:
   an element mounting substrate with a circuit pattern at least on an element mounting surface of the element mounting substrate;
   a light emitting element mounted on the element mounting surface of the element mounting substrate and connected with the circuit pattern;
   a sealing member that seals the light emitting element on the element mounting surface; and
   a coating layer that covers an element mounting side of the element mounting substrate, the coating layer being disposed on the element mounting surface of the element mounting substrate,
   wherein the coating layer has a refractive index smaller than that of the sealing member, and
   wherein a joint interface between the sealing member and the coating layer is formed at a position to which light rays emitted from the light emitting element to the sealing member in a lateral direction or obliquely downward with respect to a central axis of the light emitting element reach.

2. The light emitting device according to claim 1, wherein the sealing member has a critical angle θc of θc ≤70° with respect to the coating layer.

3. The light emitting device according to claim 1, wherein the coating layer comprises a light scattering material scattered therein.

4. The light emitting device according to claim 1, wherein the coating layer comprises a phosphor dispersed therein, and the phosphor receives a light emitted from the light emitting element and gets pumped to emit a wavelength conversion light.

5. The light emitting device according to claim 1, wherein the coating layer has a roughness at a bonding surface of the coating layer with the sealing member that is less than a roughness of the element mounting surface of the element mounting substrate.

6. The light emitting device according to claim 1, wherein the element mounting substrate, excluding a bonding region with the sealing member, and the circuit pattern, excluding a connecting region with the light emitting element, are covered with the coating layer.

7. The light emitting device according to claim 1, wherein, the light emitting element comprises a substrate comprising an epitaxial growth thin film material.

8. The light emitting device according to claim 1, wherein the sealing member includes an externally exposed surface formed as a semispherical surface.

9. The light emitting device according to claim 1, wherein the sealing member includes an end surface facing the light emitting surface of the light emitting element formed as a flat surface.

10. The light emitting device according to claim 1, wherein the sealing member has its end surface facing a light emitting surface of the light emitting element formed as a rough surface.

11. The light emitting device according to claim 1, wherein the sealing member includes a main body part that seals the light emitting element, and a cover part the covers an end surface of the main body part on a side opposite to an element side, and the cover part comprises a material having a refractive index smaller than a refractive index of a material of the main body part.

12. The light emitting device according to claim 9, wherein the sealing member comprises a phosphor dispersed therein, with the phosphor receiving a light emitted from the light emitting element and pumped to generate a wavelength conversion light.

13. The light emitting device according to claim 10, wherein the sealing member comprises a phosphor dispersed therein, with the phosphor receiving the light emitted from the light emitting element and pumped to generate a wavelength conversion light.

14. The light emitting device according to claim 11, wherein the sealing member comprises a phosphor dispersed therein, with the phosphor receiving the light emitted from the light emitting element and pumped to generate a wavelength conversion light.

15. The light emitting device according to claim 11, wherein the sealing member has an interface between the main body part and the cover part formed as an embossed surface.

16. The light emitting device according to claim 12, wherein the sealing member has a volumetric concentration of the phosphor in the cover part higher than a volumetric concentration of the phosphor in the main body part.

17. The light emitting device according to claim 13, wherein the sealing member has a volumetric concentration of the phosphor in the cover part higher than a volumetric concentration of the phosphor in a main body part of the sealing member.

18. The light emitting device according to claim 14, wherein the sealing member has a volumetric concentration of the phosphor in the cover part higher than a volumetric concentration of the phosphor in the main body part.

19. The light emitting device according to claim 1, wherein, in the element mounting side of the element mounting substrate, the coating layer is further disposed on an upper surface of the circuit pattern.

\* \* \* \* \*